United States Patent
Lee et al.

(10) Patent No.: US 8,411,509 B2
(45) Date of Patent: Apr. 2, 2013

(54) MEMORY AND METHOD FOR CHARGING A WORD LINE THEREOF

(75) Inventors: Chun-Yi Lee, Hsinchu (TW); Yung-Feng Lin, Taoyuan (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 289 days.

(21) Appl. No.: 11/976,975

(22) Filed: Oct. 30, 2007

(65) Prior Publication Data
US 2009/0116293 A1    May 7, 2009

(51) Int. Cl.
*G11C 11/34* (2006.01)
(52) U.S. Cl. .......... 365/185.23; 365/185.13; 365/230.06
(58) Field of Classification Search ............. 365/185.13, 365/185.23, 185.25, 230.06, 203
See application file for complete search history.

(56) References Cited

U.S. PATENT DOCUMENTS

| | | | | |
|---|---|---|---|---|
| 6,144,610 | A * | 11/2000 | Zheng et al. | 365/230.06 |
| 7,474,556 | B2 * | 1/2009 | Choi et al. | 365/163 |
| 2003/0235089 | A1 * | 12/2003 | Mueller et al. | 365/200 |
| 2004/0233711 | A1 * | 11/2004 | Inaba | 365/171 |
| 2007/0247953 | A1 * | 10/2007 | Huang | 365/230.03 |
| 2007/0258312 | A1 * | 11/2007 | Richards | 365/230.03 |

\* cited by examiner

*Primary Examiner* — Douglas King
(74) *Attorney, Agent, or Firm* — Bacon & Thomas, PLLC

(57) ABSTRACT

A memory and method for charging a word line thereof are disclosed. The memory includes a first word line driver, a first word line and a first switch. The first word line driver is connected to a first operational voltage for receiving a first control signal. The first word line comprises a start terminal connected to an output terminal of the first word line driver. The first switch is connected to a second operational voltage and an end terminal of the first word line. The second operational voltage is not smaller than the first operational voltage. When the first word line driver is controlled by the first control signal to start charging up the first word line, the first switch is simultaneously turned on to provide another charging path for the first word line until the first word line is charged to the first operational voltage.

20 Claims, 3 Drawing Sheets

MEMORY AND METHOD FOR CHARGING A WORD LINE THEREOF

BACKGROUND OF THE INVENTION

1. Field of the Invention

The invention relates in general to a memory and method for charging a word line thereof, and more particularly to a memory and method for charging a word line thereof, which can reduce charging time of the word line.

2. Description of the Related Art

FIG. 1 is a schematic diagram of word-line driving of a conventional flash memory. The conventional flash memory 100 includes at least a word line driver 110 and a word line 120. The word line driver 110 is connected to an operational voltage GWL and controlled by an address-control signal PP. The word line 120 is connected to an output terminal of the word line driver 110. In a read or program operation, the word line driver 110 is controlled by the control signal PP to charge up the word line 120 for supplying the operational voltage GWL to memory cells (not shown in the figure).

The time constant of the charging period is RC wherein R is the total resistance $(R1+ \ldots +Rn)$ of the word line 120 and C is the total capacitance $(C1+ \ldots +C(n+1))$ of transistors connected to the word line 120. The charging time of the word line 120 is about 3~5 times of the time constant RC. Conventionally, the word line 120 is made of poly material, and the poly resistance R of the word line 120 is normally more than $30K\Omega$. Therefore, the high poly resistance R of the word line 120 will greatly lower down the charge speed of the word line 120 and thus reduce the speed of the read/program operation.

To solve the above issue, traditionally, a metal strap (not shown in the figure) may be formed between a start terminal and an end terminal of each word line 120 so as to reduce the resistance of the word line 120. However, along with the tendency that the memory is designed to be thin and small, the pitch of the word line 120 is narrowed such that there is no enough space to put the strap metal for each word line 120.

SUMMARY OF THE INVENTION

The invention is directed to a memory and method for charging a word line thereof, which can speed up a read operation of the memory by lowering down resistance of the word line in a charging period.

According to a first aspect of the present invention, a memory is provided. The memory comprises a first word line driver, a first word line and a first switch. The first word line driver is connected to a first operational voltage for receiving a first control signal. The first word line comprises a start terminal connected to an output terminal of the first word line driver. The first switch is connected to a second operational voltage and an end terminal of the first word line. The second operational voltage is not smaller than the first operational voltage. When the first word line driver is controlled by the first control signal to start charging up the first word line, the first switch is simultaneously turned on to provide another charging path for the first word line until the first word line is charged to the first operational voltage.

According to a second aspect of the present invention, a method for charging up a word line of a memory is provided. The memory comprises a word line driver connected to a first operational voltage for charging up the word line. The method comprises charging up the word line by the word line driver, and simultaneously turning on a switch to supply a second operational voltage to an end terminal of the word line to provide another charging path for the word line, wherein the second operational voltage is not smaller than the first operational voltage; and stopping charging the word line by the word line driver and simultaneously turning off the switch so as to charge the word line to the first operational voltage.

According to a third aspect of the present invention, a memory is provided. The memory comprises a first word line driver, a first word line and a first switch. The first word line driver is connected to a first operational voltage by receiving a first control signal. The first word line comprises a start terminal connected to an output terminal of the first word line driver. The first switch is connected to the first operational voltage via a connection line and an end terminal of the first word line. When the first word line driver is controlled by the first control signal to start charging up the first word line, the first switch is simultaneously turned on to provide another charging path for the first word line until the first word line is charged to the first operational voltage.

The invention will become apparent from the following detailed description of the preferred but non-limiting embodiments. The following description is made with reference to the accompanying drawings.

DETAILED DESCRIPTION OF THE INVENTION

Figure 1:
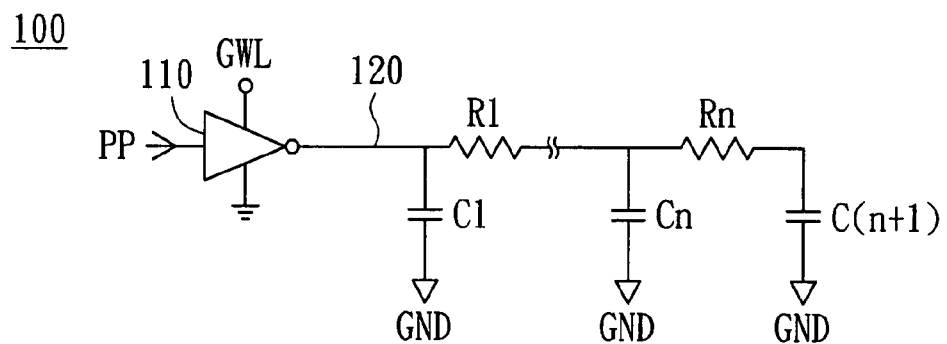
FIG. 1 is a schematic diagram of word-line driving of a conventional flash memory.
Figure 2:
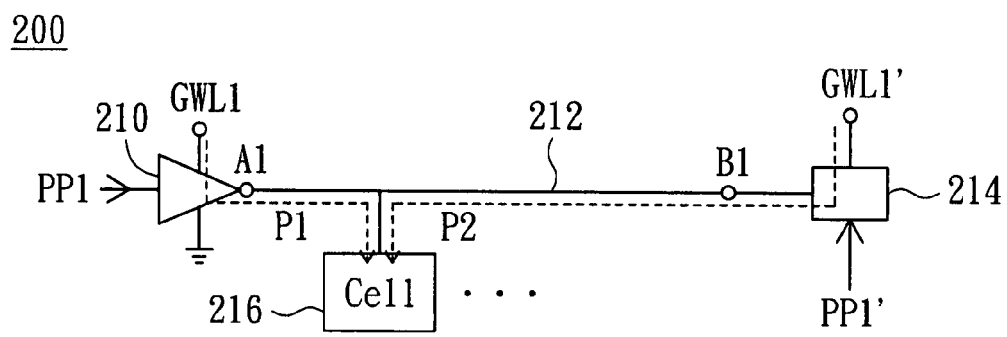
FIG. 2 is a block diagram of a memory according to a preferred embodiment of the invention.

Referring to FIG. 2, a block diagram of a memory according to a preferred embodiment of the invention is shown. A memory 200, such as a flash memory, at least includes a first word line driver 210, a first word line 212, a first switch 214, and a number of memory cells 216. The first word line driver 210 is connected to a first operational voltage GWL1 for receiving a first control signal PP1, such as an address-control signal. The first word line 212 includes a start terminal A1 connected to an output terminal of the first word line driver 210. The first word line driver 210 is used to drive the first word line 212 to provide a WL voltage (i.e. the first operational voltage GWL1) to the memory cells 216 for a read/program operation.

The first switch 214 is connected to a second operational voltage GWL1' and an end terminal B1 of the first word line 212, and controlled by a first switch-control signal PP1', wherein the second operational voltage GWL1' is not smaller than the first operational voltage GWL1.

When the first word line driver 210 is controlled by the first control signal PP1 to start charging up the first word line 212 and the corresponding memory cell 216 via a charging path P1 in the read/program operation, the first switch 214 is simultaneously turned on by the first switch-control signal PP1' to provide another charging path P2 for the first word line 212 and the corresponding memory cell 216 until the first word line 212 and the corresponding memory cell 216 are charged to the first operational voltage GWL1.

While the first word line 212 is charged to the required voltage GWL1, the first switch 214 is turned off by the first switch-control signal PP1'. The voltage of the first word line 212 is kept at GWL1 for a period of time in the read/program operation, and then the first word line driver 210 is controlled by the first control signal PP1 to stop charging the first word line 212 before the charging operation of the next word line. By providing another charging path P2 for the word line 212 in the charging period, the resistance of the word line 212 can be reduced to increase charging speed of the word line 212. As a result, the read/program operation of the memory 200 can be speeded up.

Figure 3:
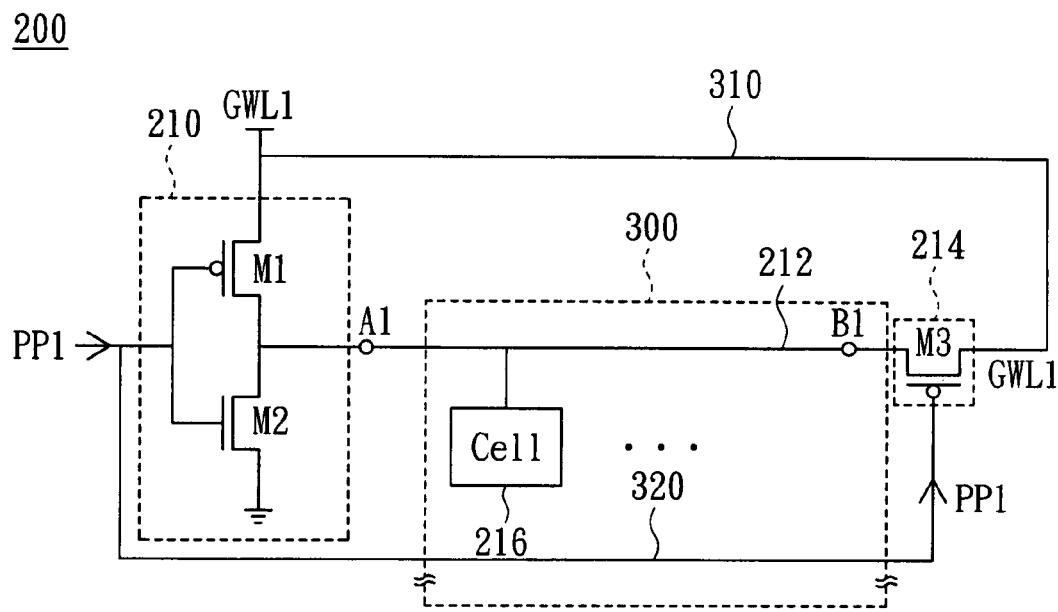
FIG. 3 is a circuit diagram of the memory according to the preferred embodiment of the invention.

Referring to FIG. 3, a circuit diagram of the memory 200 according to the preferred embodiment of the invention is shown. For example, the first word line driver 210 includes a p-type metal oxide semiconductor (PMOS) transistor M1 and an n-type metal oxide semiconductor (NMOS) transistor M2. The PMOS transistor M1 has a source connected to the first operational voltage GWL1 and a gate for receiving the first control signal PP1. The NMOS transistor M2 has a source grounded (or connected to a negative power source NVSS (not shown) for an erase operation), a gate for receiving the first control signal PP1 and a drain connected to the drain of the PMOS transistor M1 as an output terminal. Although the word line driver 210 is exemplified to have the two transistors M1 and M2 in the example, the word line driver 210 of the invention is not limited thereto, and can have any other structure in practical applications.

For example, the first switch 214 is a PMOS transistor M3, which is the same type of transistor as the transistor M1. In the example, the second operational voltage GWL1' is chosen to be the first operational voltage GWL1, and the first switch-control signal PP1' is chosen to be the first control signal PP1. The PMOS transistor M3 has a source connected to the first operational voltage GWL1 via a connection line, such as a first metal line 310 (made of poly metal), a gate for receiving the first control signal PP1 via a transmission line 320 and a drain connected to the end terminal B1 of the first word line 212.

The first word line 212 is disposed on a cell array 300 of the memory 200 and the first switch 214 is disposed at a region outside the cell array 300, such as the right side of the cell array 300 as shown in FIG. 3. As for the first metal line 310, it can be chosen to be disposed outside the cell array 300 as shown in FIG. 3, or be chosen to be disposed inside the cell array 300. Besides, the transmission line 320 can be chosen to be disposed inside the cell array 300 as shown in FIG. 3, or be chosen to be disposed outside the cell array 300.

Figure 4:
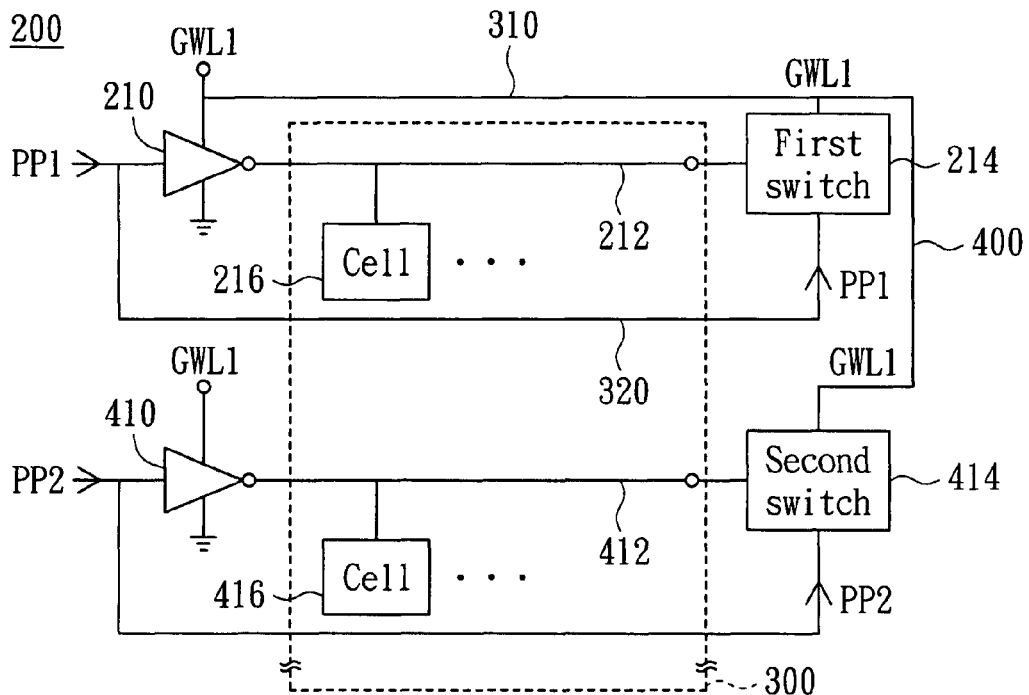
FIG. 4 is an array diagram of the memory in FIG. 3.

Referring to FIG. 4, an array diagram of the memory 200 in FIG. 3 is shown. The memory 200 further includes a second word line driver 410, second word line 412 and a second switch 414. The second word line driver 410 is connected to the first operational voltage GWL1 for receiving a second control signal PP2. The second word line 412 is disposed on the cell array 300 and connected to an output terminal of the second word line driver 410. The second switch 414 is connected to an end terminal of the second word line 412 and controlled by the second control signal PP2. Besides, the second switch 414 is further connected to a terminal of the first switch for coupling with the first operational voltage GWL1 via a connection line, such as a second metal line 400.

When the second word line driver 410 is controlled by the second control signal PP2 to start charging up the second word line 412 and the corresponding memory cells 416 in the read/program operation, the second switch is simultaneously turned on by the second control signal PP2 to charge the second word line 414 and the corresponding memory cells 416 to the first operational voltage GWL1. Similarly, when the second word line driver 410 is controlled by the second control signal PP2 to stop charging the second word line 412, the second switch 414 is turned off by the second control signal PP2.

It is noted that as shown in FIG. 4, the first switch 214 and the second switch 414 are disposed at the same (right) side out of the cell array 300, and the second metal line 400 is also disposed outside the cell array 300.

Figure 5:
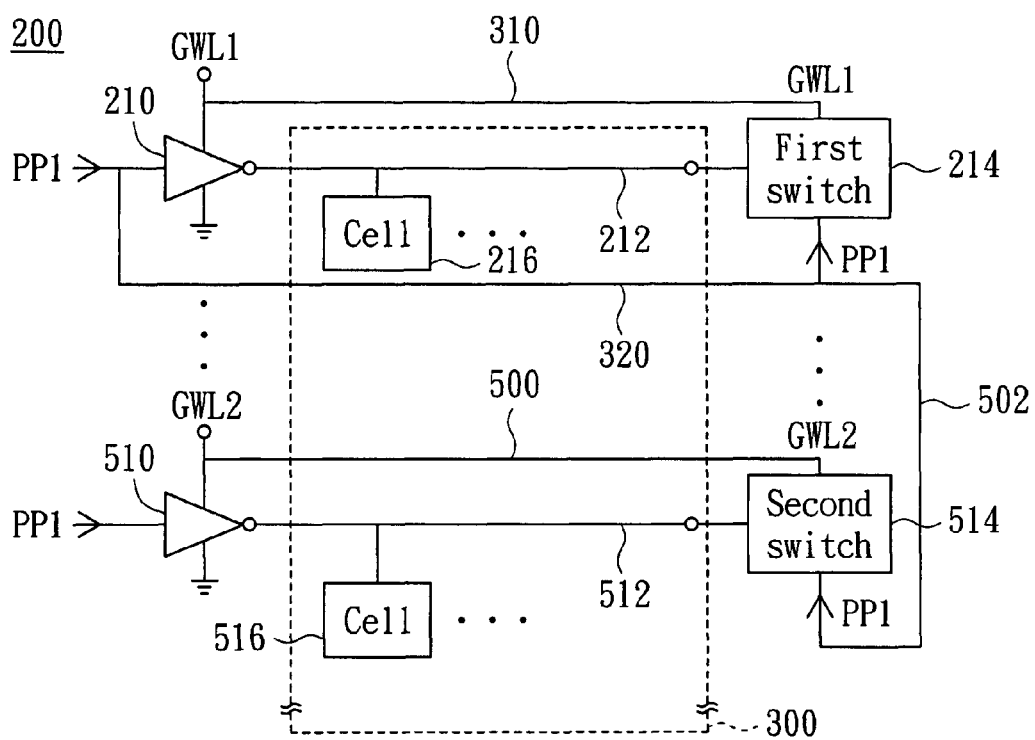
FIG. 5 is another array diagram of the memory in FIG. 3.

Referring to FIG. 5, another array diagram of the memory 200 in FIG. 3 is shown. The memory 200 further includes a second word line driver 510, a second word line 512 and a second switch 514. The second word line driver 510 is connected to a third operational voltage GWL2 for receiving the first control signal PP1. The second word line 512 is connected to an output terminal of the second word line driver 510. The second switch 514 is connected to the third operational voltage GWL2 via a connection line, such as a second metal line 500 and an end terminal of the second word line 512. The second switch 514 is further connected to a terminal of the first switch 214 for receiving the first control signal PP1 via a transmission line 502.

When the second word line driver 520 is controlled by the first control signal PP1 to start charging up the second word line 512, the second switch 514 is simultaneously turned on by the first control signal PP1 to provide another charging path for the corresponding memory cells 516. When the second word line driver 520 is controlled by the first control signal PP1 to stop charging the second word line 512, the second switch 514 is turned off by the first control signal PP1.

Similar to the switches 214 and 414 of FIG. 4, the first switch 214 and the second switch 514 are disposed at the same (right) side out of the cell array 300, and the transmission line 502 is disposed outside the cell array 300.

Figure 6:
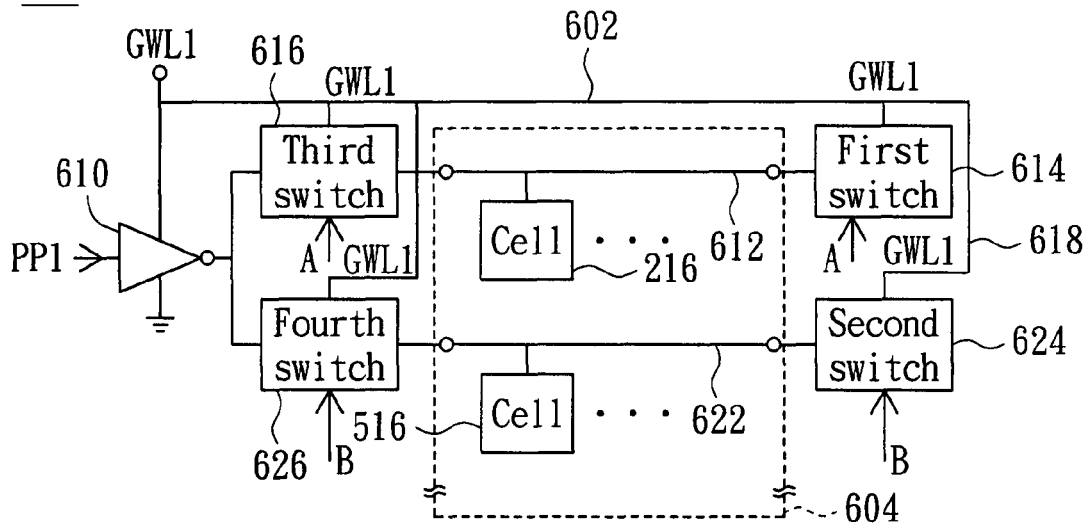
FIG. 6 is a block diagram of a memory according to another example of the invention.

Although the memory of the invention is exemplified to drive a word line by a word line driver in the above embodiment, the memory of the invention can also use a word line driver to drive a number of word lines. As shown in FIG. 6, a memory 600 drives a first word line 612 and a second word line 622 by a first word line driver 610. The first word line 612 is connected to the first word line driver 610 via a third switch 616 and the second word line 622 is connected to the first word line driver 610 via a fourth switch 626. A first switch 614 is connected to the first operational voltage GWL1 via a first metal line 602 and connected to the first word line 612. The second switch 628 is connected to the terminal of the first switch 614 for coupling with the first operational voltage GWL1 via a second metal line 618 and connected to the second word line 622.

When the third switch 616 is turned on (e.g. by a control signal A) and the first word line driver 610 is controlled by the first control signal PP1 to start charging up the first word line 612, the first switch 614 is simultaneously turned on (e.g. by the control signal A); when the fourth switch 626 is turned on (e.g. by a control signal B) and the first word line driver 610 is controlled by the first control signal PP1 to start charging up the second word line 622, the second switch 624 is simultaneously turned on (e.g. by the control signal B). Similar to FIG. 4, the first switch 614 and the second switch 624 are disposed at the same (right) side out of the cell array 604 and the second metal line 618 is disposed outside the cell array 604.

As mentioned above, the word lines connected to the word line drivers coupling with the same operational voltage (GWL1) need only one metal line (like the metal line 310 in FIG. 4 or the metal line 602 in FIG. 6) connected from the source terminal of the operational voltage (GWL1) to the corresponding first/second switch for providing another charging path. The word lines connected to the word line drivers receiving the same control signal (PP1) need only one transmission line (like the transmission line 320 in FIG. 5) connected from the source terminal of the control signal (PP1) to the corresponding first/second switch for controlling the first/second switch.

Therefore, for a memory having n (=32) groups of word line drivers and each group having m (=8) word line drivers, in order to provide another charging path to reduce resistance of word lines, the invention requires at most n metal lines to be disposed across the cell array for coupling the charging switches (the first and second switches) with the operational voltages and requires at most m transmission lines to be disposed across the cell array for coupling the charging switches with the control signals.

As a result, the number of the connection lines additionally disposed across the cell array is (n+m), such as (32+8=40) in total, which is very smaller than the number (n×m), such as (32×8=256) of metal straps required to be disposed on the word lines in the prior art. Besides, the charging switches are disposed outside the cell array, which will not occupy any space of the cell array. Therefore, the memory of the invention can prevent the prior-art issue of having no enough space for disposing the metal straps as the memory is designed to be thinner and smaller meanwhile it can reduce resistance of the word lines in a charging period to speed up the read/program operation.

Figure 7:
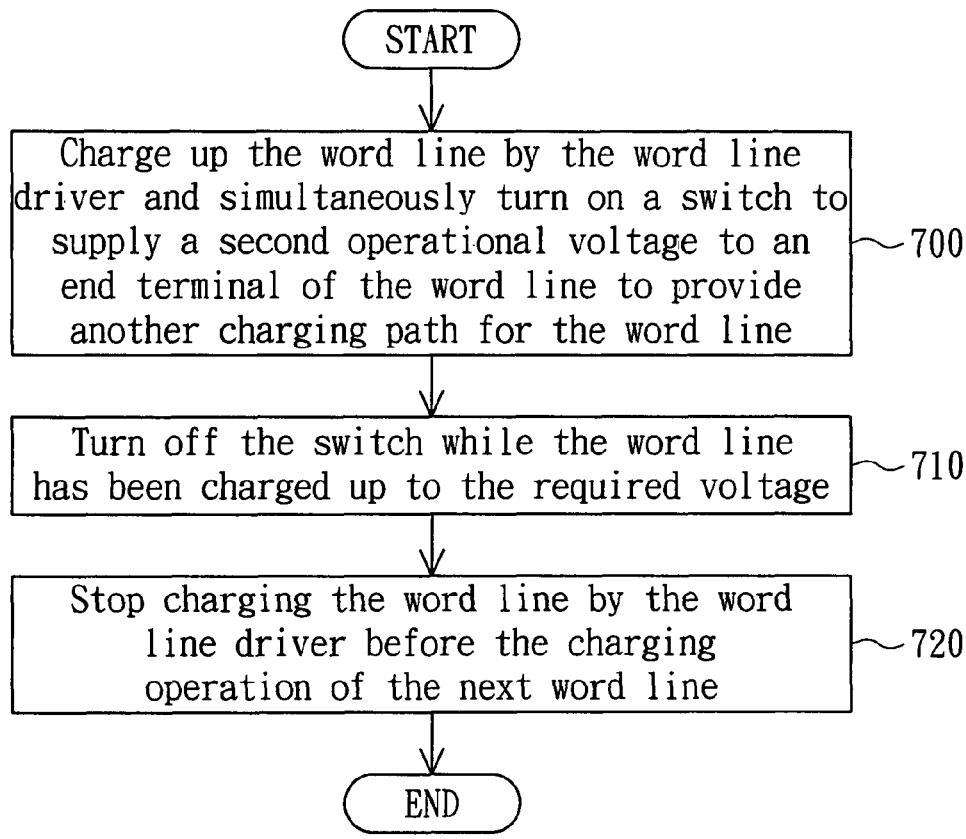
FIG. 7 is a flow chart of a method for charging up a word line of a memory according to the preferred embodiment of the invention.

Referring to FIG. 7, a flow chart of a method for charging up a word line of a memory according to the preferred embodiment of the invention is shown. Take the memory 200 in FIG. 2 as an example for illustration. At first, in step 700, controlling the word line driver 212 by the control signal PP1 to charge up the word line 212 (via the charging path P1) for a read/program operation and simultaneously turn on the switch 214 by the control signal PP1' to supply a second operational voltage GWL1' to the end terminal B1 of the word line 212 so as to provide another charging path P2 for the word line 212, wherein the second operational voltage GWL1' is not smaller than the first operational voltage GWL1. The second operational voltage GWL1' can be chosen to be the first operational voltage GWL1, and the first switch 214 is connected to the first operational voltage GWL1 via the metal line 310 as shown in FIG. 3.

Next, in step 710, turn off the switch 214 by the control signal PP1' while the word line 212 has been charged up to the required voltage GWL1. At the time, the voltage of the word line 212 is kept at GWL1 for a period of time in the read/program operation. Then, in step 720, stop charging the word line 212 by the word line driver 210 before the charging operation of the next word line. By controlling the switch 214 to provide another charging path in the charging period, the resistance of the word lines as charging can be reduced to improve the charging speed of the word lines, thereby speeding up the read/program operation of the memory.

The memory and method for charging a word line thereof disclosed by the above embodiment of the invention can effectively lower down the resistance of the world lines in a charging period by providing another charging path for the word lines through switch control. Therefore, the charging time of the word lines can be reduced and the read/program operation of the memory can be thus speeded up. Besides, the number of the connection lines required to be disposed across the cell array is very smaller than that of metal straps required in the prior art, which will not occupy much space of the cell array.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising:
    a cell array, comprising a plurality of memory cell rows;
    a first word line driver, connected to a first operational voltage and receiving a first control signal;
    a first word line, comprising a start terminal directly connected to an output terminal of the first word line driver, wherein the first word line is electrically coupled to one of the memory cell rows and the first word line has an end terminal, the start terminal and the end terminal are not further connected to any other word line for selecting memory cells; and
    a first switch, comprising a first terminal directly connected to the end terminal of the first word line and a second terminal receiving the first operational voltage via a connection line, wherein the connection line is directly connected to a terminal of the first word line driver which receives the first operational voltage;
    wherein when the first word line driver is controlled by the first control signal to start charging up the first word line, the first switch is simultaneously turned on to provide another charging path for the first word line until the first word line is charged to the first operational voltage; and
    wherein when the first word line driver is controlled by the first control signal to stop charging up the first word line, the first switch is turned off such that the start terminal of the first word line is connected to ground through the first word line driver while the end terminal of the first word line is connected to ground only through the start terminal of the first word line.

2. The memory according to claim 1, is a flash memory.

3. The memory according to claim 1, wherein while the first word line is charged to the first operational voltage, the first switch is turned off.

4. The memory according to claim 1, wherein the connection line is a first metal line.

5. The memory according to claim 4, wherein the first word line driver comprises a p-type metal oxide semiconductor (MOS) transistor with a source connected to the first operational voltage and a gate for receiving the first control signal, the first switch is a p-type MOS transistor with a source connected to the first operational voltage via the first metal line and a gate for receiving the first control signal.

6. The memory according to claim 4, further comprising:
    a second word line, disposed on the cell array; and
    a second switch, connected to an end terminal of the second word line and a terminal of the first switch for coupling with the first operational voltage via a second metal line, wherein the second switch is turned on when the second word line starts to charge up.

7. The memory according to claim 6, further comprising a second word line driver for receiving a second control signal, wherein the second word line is connected to the second word line driver and the second switch is controlled to turn on by the second control signal.

8. The memory according to claim 6, wherein the first word line is connected to the first word line driver via a third switch, the second word line is connected to the first word line driver via a fourth switch, when the third switch is turned on and the first word line driver starts to charge up the first word line, the first switch is simultaneously turned on; when the fourth switch is turned on and the first word line driver starts to charge up the second word line, the second switch is simultaneously turned on.

9. The memory according to claim 6, wherein the first switch and the second switch are disposed at the same side out of the cell array, and the second metal line is disposed outside the cell array.

10. The memory according to claim 1, further comprising:
a second word line driver, connected to a third operational voltage and receiving the first control signal;
a second word line, connected to an output terminal of the second word line driver;
a second switch, connected to the third operational voltage via a second metal line and an end terminal of the second word line, wherein the second switch is connected to a terminal of the first switch for receiving the first control signal via a transmission line;
wherein when the second word line starts to charge up, the second switch is simultaneously turned on by the first control signal.

11. The memory according to claim 10, wherein the first switch and the second switch are disposed at the same side out of the cell array, and the transmission line is disposed outside the cell array.

12. The memory according to claim 1, wherein the first switch receives the first control signal and the first control signal is transmitted from the first word line driver to the first switch.

13. The memory according to claim 1, wherein when the first word line driver is controlled by the first control signal to start charging up the first word line, the first word line driver provides the first operational voltage to the first word line via the start terminal, and the first switch is simultaneously turned on to provide the first operational voltage to the first word line via the end terminal until the first word line is charged to the first operational voltage.

14. The memory according to claim 1, wherein the cell array is a continuous cell array without being blocked by any switch, and the end terminal of the first word line is located in the cell array.

15. A method for charging up a word line of a memory, the memory comprising a cell array and a word line driver, the word line driver having a first terminal connected to a first operational voltage for charging up the word line, comprising:
charging up the word line by the word line driver, simultaneously turning on a switch and supplying the first operational voltage to an end terminal of the word line via a connection line directly connected to the first terminal of the word line driver to provide another charging path for the word line, wherein the word line comprises a start terminal directly connected to an output terminal of the word line driver, the switch comprises a terminal directly connected to the end terminal of the word line, and the start terminal and the end terminal of the word line are not further connected to any other word line for selecting memory cells; and
when the word line driver is controlled to stop charging up the word line, turning off the switch such that the start terminal of the word line is connected to ground through the word line driver and the end terminal of the word line is connected to ground only through the start terminal of the word line while the word line is charged to the first operational voltage.

16. The method according to claim 15, wherein after the step of turning off the switch, the method further comprises stopping charging the word line by the word line driver before a charging operation of a next selected word line.

17. The method according to claim 15, wherein the connection line is a metal line.

18. The method according to claim 17, wherein the step of charging up the word line comprises controlling the word line driver by a control signal to charge up the word line and simultaneously turning on the switch by the control signal to provide another charging path for the word line; the step of stopping charging the word line comprises controlling the word line driver by the control signal to stop charging the word line and simultaneously turning off the switch by the control signal.

19. The method according to claim 15, wherein the switch is a MOS transistor.

20. The method according to claim 15, wherein the memory is a flash memory.

* * * * *